(12) United States Patent
Berthelsen et al.

(10) Patent No.: US 9,813,812 B2
(45) Date of Patent: Nov. 7, 2017

(54) METHOD OF CONTROLLING DIAPHRAGM EXCURSION OF ELECTRODYNAMIC LOUDSPEAKERS

(71) Applicant: Analog Devices Global, Hamilton (BM)

(72) Inventors: Kim Spetzler Berthelsen, Køge (DK); Miguel Alejandro Chavez Salas, Cambridge, MA (US); Kasper Strange, København Ø (DK)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/569,182

(22) Filed: Dec. 12, 2014

(65) Prior Publication Data
US 2016/0173983 A1 Jun. 16, 2016

(51) Int. Cl.
*H03G 11/00* (2006.01)
*H04R 3/00* (2006.01)
(Continued)

(52) U.S. Cl.
CPC ............. *H04R 3/007* (2013.01); *H03G 9/005* (2013.01); *H03G 9/025* (2013.01); *H04R 29/001* (2013.01); *H04R 2430/03* (2013.01)

(58) Field of Classification Search
CPC .. H04R 3/007; H04R 29/001; H04R 2430/03; H03G 9/005; H03G 9/025
See application file for complete search history.

(56) References Cited

U.S. PATENT DOCUMENTS 3,875,341 A 4/1975 Gassmann
4,541,109 A 9/1985 Shimizu et al.
(Continued)

FOREIGN PATENT DOCUMENTS

DE 19804992 C1 8/1999
EP 2453670 A1 5/2012
(Continued)

OTHER PUBLICATIONS

Clark, "Amplitude Modulation Method for Measuring Linear Excursion of Loudspeakers", Audio Engineering Society Convention Papers, AES Convention 89, Sep. 1990, 18 pages.
(Continued)

*Primary Examiner* — Andrew L Sniezek
(74) *Attorney, Agent, or Firm* — Schwegman Lundberg & Woessner, P.A.

(57) ABSTRACT

The present application relates in one aspect to a method of controlling diaphragm excursion of an electrodynamic loudspeaker. The method comprises dividing the audio input signal into at least a low-frequency band signal and a high-frequency band signal by a band-splitting network and applying the low-frequency band signal to a diaphragm excursion estimator. The instantaneous diaphragm excursion is determined based on the low-frequency band signal. The determined instantaneous diaphragm excursion is compared with an excursion limit criterion. The low-frequency band signal is limited based on a result of the comparison between the instantaneous diaphragm excursion and the excursion limit criterion to produce a limited low-frequency band signal which is combined with the high-frequency band signal to produce an excursion limited audio signal.

27 Claims, 6 Drawing Sheets

(51) Int. Cl.
*H03G 9/00* (2006.01)
*H03G 9/02* (2006.01)
*H04R 29/00* (2006.01)

(56) References Cited

U.S. PATENT DOCUMENTS

| | | |
|---|---|---|
| 5,031,221 A | 7/1991 | Yokoyama |
| 5,548,650 A | 8/1996 | Clark |
| 5,613,218 A | 3/1997 | Li et al. |
| 5,931,221 A | 8/1999 | Inoue et al. |
| 7,034,731 B2 | 4/2006 | Uramoto et al. |
| 7,107,159 B2 | 9/2006 | German |
| 7,298,296 B1 | 11/2007 | Kamath |
| 7,372,966 B2 | 5/2008 | Bright |
| 7,716,808 B2 | 5/2010 | Hutt et al. |
| 8,538,039 B2 | 9/2013 | Pfaffinger |
| 8,712,065 B2 | 4/2014 | Solgaard et al. |
| 2003/0021427 A1 | 1/2003 | Nakada et al. |
| 2004/0178852 A1 | 9/2004 | Neunaber |
| 2006/0172716 A1 | 8/2006 | Yoshii et al. |
| 2007/0041606 A1 | 2/2007 | Sheppard |
| 2008/0013750 A1* | 1/2008 | Suzuki .............. H04R 3/04 381/97 |
| 2009/0058549 A1 | 3/2009 | Kost |
| 2009/0098714 A1 | 4/2009 | Chang et al. |
| 2009/0268918 A1 | 10/2009 | Solgaard et al. |
| 2011/0044471 A1* | 2/2011 | Aarts ................ H04R 3/04 381/98 |
| 2011/0258489 A1 | 10/2011 | Nielsen |
| 2012/0179456 A1* | 7/2012 | Ryu ................. H04R 3/007 704/200.1 |
| 2012/0195443 A1 | 8/2012 | Kim et al. |
| 2012/0249125 A1 | 10/2012 | Yamkovoy et al. |
| 2012/0281844 A1 | 11/2012 | Luo et al. |
| 2012/0308046 A1 | 12/2012 | Muza |
| 2013/0022208 A1* | 1/2013 | Dhuyvetter .......... H03G 11/002 381/55 |
| 2013/0077795 A1 | 3/2013 | Risbo et al. |
| 2013/0170660 A1 | 7/2013 | Kristensen et al. |
| 2013/0259245 A1 | 10/2013 | Cheng et al. |
| 2013/0287203 A1* | 10/2013 | Hodges ............. H04M 9/082 379/406.01 |
| 2014/0064502 A1* | 3/2014 | Hoang Co Thuy .. H04R 29/003 381/59 |
| 2014/0254805 A1 | 9/2014 | Su et al. |
| 2015/0229353 A1* | 8/2015 | Berthelsen ......... H04M 9/082 379/406.08 |
| 2016/0014508 A1* | 1/2016 | Su ................... H04R 3/007 381/55 |

FOREIGN PATENT DOCUMENTS

| | | |
|---|---|---|
| EP | 2498511 A1 | 9/2012 |
| EP | 2538699 A1 | 12/2012 |
| WO | 97/03536 A1 | 1/1997 |

OTHER PUBLICATIONS

Clark et al., "Modeling and Controlling Excursion-Related Distortion in Loudspeakers", Audio Engineering Society Convention Papers, AES Convention 106, May 1999, 14 pages.

Dodd et al., "Voice Coil Impedance as a Function of Frequency and Displacement", Audio Engineering Society Convention Papers, AES Convention 117, Oct. 2004, 17 pages.

Klippel, "Active Reduction of Nonlinear Loudspeaker Distortion", Active 99 Conference, Dec. 1999, 12 pages.

Klippel, "Assessment of Voice-Coil Peak Displacement Xmax", Journal of the Audio Engineering Society, vol. 51, No. 5, May 2003, pp. 307-323.

Klippel, "Loudspeaker Nonlinearities—Causes, Parameters, Symptoms", Audio Engineering Society Convention Papers, AES Convention 119, Oct. 2005, 69 pages.

Klippel, "Tutorial: Loudspeaker Nonlinearities—Causes, Parameters, Symptoms", Journal of the Audio Engineering Society, vol. 54, No. 10, Oct. 2006, pp. 907-939.

Luo et al., "A Model Based Excursion Protection Algorithm for Loudspeakers", IEEE International Conference on Acoustics, Speech and Signal Processing (ICASSP), Mar. 2012, pp. 233-236.

Thorborg et al., "An Improved Electrical Equivalent Circuit Model for Dynamic Moving Coil Transducers", Audio Engineering Society Convention Papers, AES Convention 122, May 2007, 13 pages.

Extended European Search Report issued Jul. 22, 2014, in European application No. 14156524.2, 11 pages.

* cited by examiner

METHOD OF CONTROLLING DIAPHRAGM EXCURSION OF ELECTRODYNAMIC LOUDSPEAKERS

FIELD OF THE INVENTION

The present invention relates in one aspect to a method of controlling diaphragm excursion of an electrodynamic loudspeaker. The method comprises dividing the audio input signal into at least a low-frequency band signal and a high-frequency band signal by a band-splitting network and applying the low-frequency band signal to a diaphragm excursion estimator. The instantaneous diaphragm excursion is determined based on the low-frequency band signal. The determined instantaneous diaphragm excursion is compared with an excursion limit criterion. The low-frequency band signal is limited based on a result of the comparison between the instantaneous diaphragm excursion and the excursion limit criterion to produce a limited low-frequency band signal which is combined with the high-frequency band signal to produce an excursion limited audio signal.

BACKGROUND OF THE INVENTION

The present invention relates to a method of controlling diaphragm excursion of an electrodynamic loudspeaker. The electrodynamic loudspeaker may for example be mounted in a substantially sealed enclosure or ventilated enclosure. The substantially sealed enclosure or a ventilated enclosure may form part of a portable communication device such as a smartphone or tablet. The electrodynamic loudspeaker may be utilized for sound reproduction purposes, e.g. as a receiver for producing sound by acoustic coupling to the user's ear, or as a loudspeaker for reproducing recorded music or for voice reproduction in teleconferencing applications.

It is of significant interest to accurately estimate and limit the diaphragm excursion or displacement of an electrodynamic loudspeaker in numerous sound reproduction applications and devices for example to protect the electrodynamic loudspeaker against mechanical damage. The accurate control or limiting of the diaphragm excursion is important to avoid the diaphragm or diaphragm assembly is driven above its maximum excursion limit. This may occur if the maximum excursion limit of the electrodynamic loudspeaker in question is exceeded and various kinds of transitory or permanent mechanical damage may be imparted to the electrodynamic loudspeaker leaving the latter temporarily or permanently inoperative. The mechanical damage may be caused by collision between movable loudspeaker components, such as the voice coil, diaphragm or voice coil bobbin, and a stationary component of the loudspeaker such as the magnetic circuit. Since electrodynamic loudspeakers generally are rather non-linear devices, in particular at high sound pressure levels, with a large number of complex non-linearities it has proved difficult to accurately estimate the diaphragm excursion by various kinds of predictive model based approaches. In addition, parameter values of linear loudspeaker parameters of the electrodynamic loudspeaker, such as mechanical compliance and voice coil resistance, also vary slowly but markedly over time and temperature which leads to further challenges in maintaining an accurate model of the electrodynamic loudspeaker. Hence, it is of significant interest and value to provide a relatively simple methodology for accurately estimating and limiting diaphragm excursion of the electrodynamic loudspeaker despite these challenges.

The present methodology of controlling the diaphragm excursion comprises dividing the audio input signal into at least a low-frequency band signal and a high-frequency band signal by a band-splitting network. The low-frequency band signal is applied to a diaphragm excursion estimator for determining the instantaneous diaphragm excursion based on the low-frequency band signal. The frequency band-splitting of the audio input signal before signal limiting is advantageous because the diaphragm excursion is much larger at and below a fundamental resonance frequency of the electrodynamic loudspeaker than above the fundamental resonance frequency. This relationship is opposite to the sound pressure level which is much higher above than below the fundamental resonance frequency of the loudspeaker. To provide good excursion control and therefore good loudspeaker protection without unduly restricting the maximum sound pressure level capability of the loudspeaker, the audio input signal is divided or split into the low-frequency and high-frequency band signals. A cross-over frequency of the band-splitting network may lie above the fundamental resonance frequency of the electrodynamic loudspeaker such that the high-frequency band signal lies above the fundamental resonance frequency. The low-frequency band signal may therefore lie at the fundamental resonance frequency and below the fundamental resonance frequency of the electrodynamic loudspeaker. In this manner, the low-frequency band signal may be separately limited to prevent excessive diaphragm excursion and protect the loudspeaker while the high-frequency band signal may remain essentially unlimited. Hence, the subjective loudness of the sound generated by electrodynamic loudspeaker remains relatively unaffected of the limitation of the diaphragm excursion.

SUMMARY OF THE INVENTION

A first aspect of the invention relates to a method of controlling diaphragm excursion of a loudspeaker such as an electrodynamic loudspeaker. The method of controlling the diaphragm excursion comprising steps of receiving an audio input signal from an audio signal source,
dividing the audio input signal into at least a low-frequency band signal and a high-frequency band signal by a band-splitting network having a predetermined cross-over frequency,
applying the low-frequency band signal to a diaphragm excursion estimator, determining or estimating an instantaneous diaphragm excursion based on the low-frequency band signal,
comparing the instantaneous diaphragm excursion with an excursion limit criterion, limiting the low-frequency band signal based on a result of the comparison between the instantaneous diaphragm excursion and the excursion limit criterion to produce a limited low-frequency band signal,
combining the limited low-frequency band signal and high-frequency band signal to produce an excursion limited audio signal.

The present diaphragm excursion control methodology and corresponding sound reproduction circuit may be applied to a wide range of electrodynamic loudspeakers in various applications such as low-frequency or broad-band loudspeakers for High Fidelity applications, automotive or Public Address applications as well as to miniature electrodynamic loudspeakers for portable communication devices and/or music players. In the latter case, the electrodynamic loudspeaker may be integrated in a mobile phone or smartphone and mounted in a sealed, ventilated or open enclosure with a volume between 0.5 and 2.0 cm$^3$ such as about 1 cm$^3$.

The enclosure mounted electrodynamic loudspeaker may produce useful sound pressure from below 100 Hz and up to 15 kHz, or even up to 20 kHz.

The present diaphragm excursion control methodology is preferably configured to limit the diaphragm displacement or excursion sufficiently to prevent various kinds of mechanical damage to the loudspeaker as discussed above. The mechanical damage may be caused by collision between movable loudspeaker components, such as the voice coil, diaphragm or voice coil bobbin, and a stationary component such as the magnetic circuit. The limiting of the low-frequency band signal may comprise dynamic range compressing or peak clipping the low-frequency band signal in response to the instantaneous diaphragm excursion estimate meets the excursion limit criterion. The excursion limit criterion may comprise an excursion threshold which corresponds to a maximum excursion of the electrodynamic loudspeaker as specified by the loudspeaker manufacturer or to a certain amount/percentage of this maximum excursion. The skilled person will understand that the maximum excursion of a particular type of electrodynamic loudspeaker depends on its dimensions and numerous construction details. For the above-discussed miniature loudspeaker 1 with outer dimensions of approximately 11 mm*15 mm, the maximum diaphragm excursion is about +/−0.45 mm. However, loudspeakers with larger dimensions for example for home stereo or Public Address applications may have much larger maximum diaphragm excursions for example above +/−5.0 mm.

The audio input signal may comprise a real-time digital audio signal supplied from an external digital audio source such as a digital microphone. The real-time digital audio signal may be formatted according to a standardized serial data communication protocol such as IIC or SPI, or formatted according to a digital audio protocol such as I$^2$S, SPDIF etc.

The method of controlling diaphragm excursion may comprise further steps of: applying the excursion limited audio signal to a power amplifier to produce a loudspeaker drive signal, and applying the loudspeaker drive signal to the electrodynamic loudspeaker to produce sound pressure in accordance with the excursion limited audio signal. Various types of linear or pulse modulated power amplifiers may be used. The power or output amplifier may comprise a switching or class D amplifier for example a Pulse Density Modulation (PDM) or Pulse Width Modulation (PWM) output amplifier which both possess high power conversion efficiency. This is a particularly advantageous feature for use in battery powered portable communication devices. In the alternative, the output amplifier may comprise traditional non-switched power amplifier topologies like class A or class AB.

The excursion limited audio signal comprises both low-frequency and high-frequency components of the audio input signal due to the combination or summation of the low-frequency band signal and high-frequency band signal. Since the limiting of the low-frequency band signal may be substantially zero for small values of the instantaneous diaphragm excursion, low level audio input signals may propagate through the limiting step and combination step without frequency response modifications and hence without subjective signal colouring. On the other hand, for large values of the instantaneous diaphragm excursion, i.e. instantaneous diaphragm excursions that meet the excursion limit criterion, the low-frequency band signal is limited for example by peak clipping or dynamic range compression such that the level of the low-frequency band signal is reduced. This reduction of the level of the low-frequency band signal leads to a skewed frequency response of the excursion limited audio signal for large values of the instantaneous diaphragm excursion such that the level of the high-frequency components of the audio input signal is relatively increased in the excursion limited audio signal compared to the level of the low-frequency components of the audio input signal.

The splitting of the audio input signal into the high-frequency band signal and the low-frequency band signal may be performed in numerous ways either in the digital domain operating on a digitized audio input signal or in the analog domain. In some embodiments, the audio input signal is divided by a band splitting network having a predetermined cross-over frequency within the audio frequency range between 20 Hz and 20 kHz such as between 100 Hz and 10 kHz, or between 400 Hz and 2 kHz. The predetermined cross-over frequency preferably depends on the fundamental resonance frequency of the electrodynamic loudspeaker to which the excursion limited audio signal is applied as discussed below in further detail. The skilled person will understand that the fundamental resonance frequency of a given electrodynamic loudspeaker is highly variable depending on properties of the loudspeaker itself, such as diaphragm suspension and diaphragm mass, and on a specific mounting of the loudspeaker for example a value of a loudspeaker enclosure. The fundamental resonance frequency of enclosure mounted miniature electrodynamic loudspeakers for portable terminals typically lies somewhere between 400 Hz and 1.0 kHz.

One embodiment of the band splitting network possesses allpass response such that the sum of the low-frequency band signal and the high-frequency band signal provides a substantially flat (i.e. constant or unity magnitude) frequency response throughout the relevant portion of the audio frequency range.

The predetermined cross-over frequency of the band splitting network is preferably at least 1.2 times higher, and may even be at least two times higher, than the fundamental resonance frequency of the electrodynamic loudspeaker in question to ensure that major diaphragm excursion inducing signal components of the audio input signal are contained in the low-frequency band signal. In yet another embodiment, the predetermined cross-over frequency of the band splitting network lies between 1.2 and 2.5 times the fundamental resonance frequency of the electrodynamic loudspeaker in question.

In the present context, the fundamental resonance frequency of the electrodynamic loudspeaker is the resonance frequency determined or set by a total compliance acting on the movable diaphragm assembly and the total moving mass of the electrodynamic loudspeaker. The total compliance acting on the movable diaphragm assembly will typically comprise a parallel connection of a compliance of an edge suspension of the loudspeaker and a compliance caused by the trapped air inside the enclosure. The fundamental resonance frequency of the enclosure mounted electrodynamic loudspeaker can be identified by finding the local peak electrical impedance for example by inspection of the impedance curves of FIGS. 3 & 4 as discussed below in additional detail.

The dynamic range compression to limit the low-frequency band signal discussed above may be carried out in numerous ways. According to one such embodiment, the dynamic range compression comprises applying a diaphragm excursion dependent gain value to the low-frequency band signal in accordance with a predetermined gain law. The predetermined gain law may for example comprise a suitable table or a mathematical equation expressing a desired relationship or bond between the diaphragm excursion and the gain value. In one embodiment, the predetermined gain law comprises an excursion threshold value. According to the latter embodiment the predetermined gain law additionally comprises a substantially constant gain of the low-frequency band signal below the excursion threshold value and a decreasing gain value with increasing diaphragm excursion above the excursion threshold value. In the latter embodiment, the low-frequency band signal may be multiplied by a constant, such as one, for all diaphragm excursions falling below the excursion threshold value. Above the excursion threshold value, the gain value may decrease such that the level of the low-frequency band signal remains essentially constant independent of the diaphragm excursion.

The determination or estimation of the instantaneous diaphragm excursion may be carried out in numerous ways. In some embodiments of the invention, the instantaneous diaphragm excursion may be derived from a sensor signal. The sensor signal may be generated or supplied by an acceleration, velocity or displacement sensor attached to, or coupled to, the diaphragm of the loudspeaker. In an alternative embodiment the instantaneous diaphragm excursion is determined by a linear or non-linear state space model of the electrodynamic loudspeaker. According to these state space based models of the present methodology, the determination of the instantaneous diaphragm excursion comprises further steps of:

determining a voice coil voltage across the voice coil,
detecting a voice coil current in response to the voice coil voltage,
applying the detected voice coil current and determined voice coil voltage to a linear or non-linear state space model of the electrodynamic loudspeaker,
applying the low-frequency band signal to the linear or non-linear state space model of the electrodynamic loudspeaker,
determining the instantaneous diaphragm excursion from an output of the linear or non-linear state space model.

The present methodology may comprise further steps of applying the detected voice coil current and the determined voice coil voltage to a linear adaptive digital loudspeaker model comprising a plurality of adaptive loudspeaker parameters,
  computing a plurality of parameter values of the plurality of respective adaptive loudspeaker parameters based on the linear adaptive digital loudspeaker model,
  applying the plurality of parameter values to the linear or non-linear state-space model of the electrodynamic loudspeaker.

The linear adaptive digital loudspeaker model may comprise an adaptive FIR or an adaptive IIR filter. The adaptive IIR filter may be of second order or even higher order. The linear adaptive digital loudspeaker model preferably comprises at least one fixed parameter such as a total moving mass of the loudspeaker.

The features and operation of linear and non-linear state space model of the electrodynamic loudspeaker are discussed in detail below with reference to FIG. 6 of the appended drawings. The features and operation of the linear adaptive digital loudspeaker model are likewise discussed in detail below with reference to FIG. 6 of the appended drawings.

A second aspect of the invention relates to a sound reproduction circuit or an electrodynamic loudspeaker, comprising:
an audio input for receipt of an audio input signal supplied by an audio signal source,
a frequency band splitting network coupled to the audio input signal and configured for dividing the audio input signal into at least a low-frequency band signal and a high-frequency band signal,
a diaphragm excursion estimator coupled to the low-frequency band signal for determining or estimating an instantaneous diaphragm excursion based on the low-frequency band signal,
a comparator configured to comparing the instantaneous diaphragm excursion estimate with an excursion limit criterion,
a signal limiter configured for producing a limited low-frequency band signal based on a result of the comparison between the instantaneous diaphragm excursion and the excursion limit criterion to produce a limited low-frequency band signal,
a signal combiner configured for summing the limited low-frequency band signal and the high-frequency band signal to produce an excursion limited audio signal.

The sound reproduction circuit may comprise an output or power amplifier having an input coupled to the excursion limited audio signal. The output or power amplifier is configured to produce a loudspeaker drive signal across a pair of loudspeaker terminals of the sound reproduction circuit. The properties of the output or power amplifier have been disclosed in detail above in connection with the corresponding diaphragm excursion control methodology. The Class D output amplifier may comprise a half-bridge driver stage with a single output coupled to the electrodynamic loudspeaker or a full-bridge/H-bridge driver stage with the pair of output terminals coupled to respective sides or terminals of the electrodynamic loudspeaker. Properties of the frequency band splitting network have been disclosed in detail above in connection with the corresponding diaphragm excursion control methodology and are discussed in further detail below with reference to the appended drawings.

The skilled person will appreciate that the method steps and circuit function of each, or least one, of the frequency band splitting network, diaphragm excursion estimator, signal limiter and signal combiner or summer may be implemented fully or partly by a software programmable microprocessor such as a programmable Digital Signal Processor operating in accordance with executable program instructions. The software programmable microprocessor may be operating on digital domain signals applied to and outputted by the above-mentioned circuit functions. According to one such embodiment the frequency band splitting network comprises a first set of executable program instructions for the programmable microprocessor,
the diaphragm excursion estimator comprises a second set of executable program instructions for the programmable microprocessor,
the comparator comprises a third set of executable program instructions for the programmable microprocessor,
the signal limiter comprises a fourth set of executable program instructions for the programmable microprocessor; and
the signal combiner comprises a fifth set of executable program instructions for the programmable microprocessor.

In the alternative, the circuit function of each, or at least one, of the frequency band splitting network, diaphragm excursion estimator, signal limiter and signal combiner or summer may be implemented by a separate hard-wired digital logic circuit comprising appropriately configured sequential and combinatorial digital logic.

A third aspect of the invention relates to a semiconductor substrate or die on which a sound reproduction circuit according to any of the above-described embodiments thereof is integrated. The semiconductor substrate may be fabricated in a suitable CMOS or DMOS semiconductor process.

A fourth aspect of the invention relates to a sound reproduction assembly comprising: an electrodynamic loudspeaker comprising a movable diaphragm assembly for generating audible sound in response to actuation of the diaphragm assembly; and a sound reproduction circuit according to any of the above-described embodiments thereof. The pair of loudspeaker terminals of the sound reproduction circuit is electrically connected to the voice coil of the movable diaphragm assembly of the electrodynamic loudspeaker. An audio signal source is operatively coupled to the audio signal input of the sound reproduction circuit. The present sound reproduction assembly may advantageously function as a self-contained audio delivery system with integral loudspeaker excursion control that can operate independently of an application processor of the portable communication terminal to provide reliable and convenient protection against excursion induced mechanical damage of the electrodynamic loudspeaker.

BRIEF DESCRIPTION OF THE DRAWINGS

Preferred embodiments of the invention will be described in more detail in connection with the appended drawings, in which.

DETAILED DESCRIPTION OF PREFERRED EMBODIMENTS

Figure 1A:
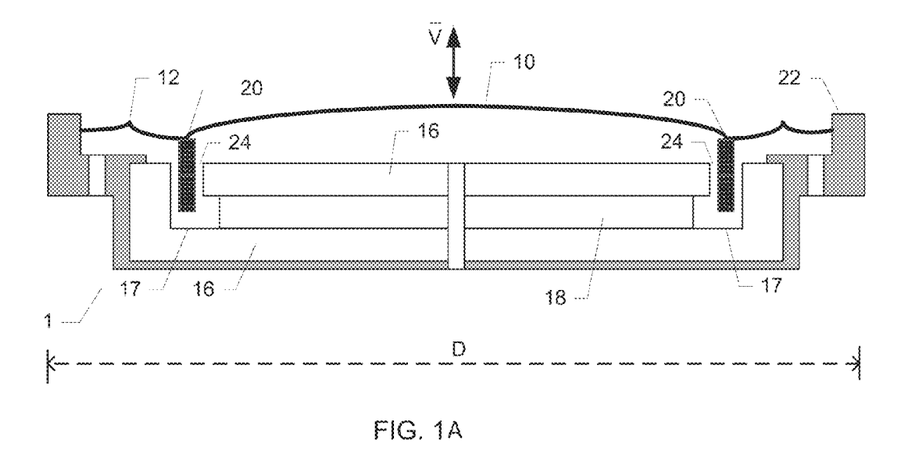
FIG. 1A) is a schematic cross-sectional view of a miniature electrodynamic loudspeaker for various portable sound reproducing applications for use in the present invention, FIG. 1B) is a schematic cross-sectional view of the miniature electrodynamic loudspeaker mounted in a closed housing or enclosure.

FIG. 1A) is a schematic cross-sectional illustration of a typical miniature electrodynamic loudspeaker 1 for sealed box mounting and use in portable audio applications such as mobile phones and smartphones where the loudspeaker 1 provides sound reproduction for various types of applications such as speaker phone and music playback. The skilled person will appreciate that electrodynamic loudspeakers exist in numerous shapes and sizes depending on the intended application. The electrodynamic loudspeaker 1 used in the below described methodologies of detecting enclosure leakage and the corresponding assemblies for detecting enclosure leakage has a rectangular shape with a maximum outer dimension, D, of approximately 15 mm and an outer dimension in transversal direction of about 11 mm. However, the skilled person will appreciate that the present methodologies for diaphragm excursion control and corresponding circuits are applicable to virtually all types of enclosure or box mounted electrodynamic loudspeakers.

The miniature electrodynamic loudspeaker 1 comprises a diaphragm 10 fastened to an upper edge surface of a voice coil. The diaphragm 10 is also mechanically coupled to a speaker frame 22 through a resilient edge or outer suspension 12. An annular permanent magnet structure 18 generates a magnetic flux which is conducted through a magnetically permeable structure 16 having a circular air gap 24 arranged therein. A circular ventilation duct 14 is arranged in the frame structure 22 and may be used to conduct heat away from an otherwise sealed chamber structure formed d beneath the diaphragm 10. The resilient edge suspension 12 provides a relatively well-defined compliance of the movable diaphragm assembly (voice coil 20 and diaphragm 10). The compliance of the resilient edge suspension 12 and a moving mass of the diaphragm 10 determines the free-air fundamental resonance frequency of the miniature loudspeaker. The resilient edge suspension 12 may be constructed to limit maximum excursion or maximum displacement of the movable diaphragm assembly.

During operation of the miniature loudspeaker 1, a voice coil voltage or drive voltage is applied to the voice coil 20 of the loudspeaker 100 thorough a pair of speaker terminals (not shown) electrically connected to a suitable output amplifier or power amplifier. A corresponding voice coil current flows in response through the voice coil 20 leading to essentially uniform vibratory motion, in a piston range of the loudspeaker, of the diaphragm assembly in the direction indicated by the velocity arrow V. Thereby, a corresponding sound pressure is generated by the loudspeaker 1. The vibratory motion of the voice coil 20 and diaphragm 10 in response to the flow of voice coil current is caused by the presence of a radially-oriented magnetic field in the air gap 24. The applied voice coil current and voltage lead to power dissipation in the voice coil 20 which heats the voice coil 20 during operation. Hence, prolonged application of too high drive voltage and current may lead to overheating of the voice coil 20 which is another common cause of failure in electrodynamic loudspeakers.

The application of excessively large voice coil currents which force the movable diaphragm assembly beyond its maximum allowable excursion limit is another common fault mechanism in electrodynamic loudspeakers leading to various kinds of irreversible mechanical damage. One type of mechanical damage may for example be caused by collision between the lowermost edge of the voice coil 20 and an annular facing portion 17 of the magnetically permeable structure 16. Another type of mechanical damage may for example be caused by stretching the resilient edge suspension 12 above its breaking point.

Figure 1B:
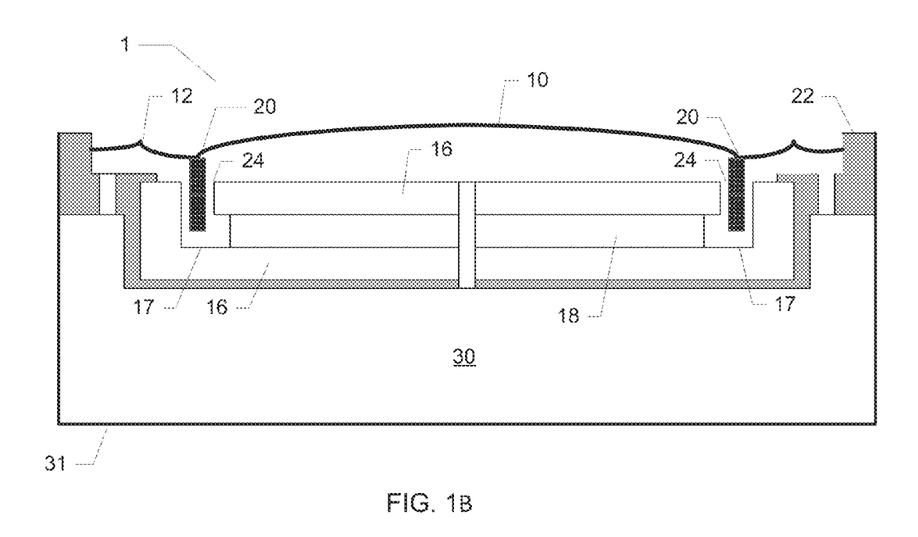

FIG. 1B) is a schematic cross-sectional illustration of the miniature electrodynamic loudspeaker 1 mounted in an enclosure, box or chamber 31 having a predetermined interior volume 30. The enclosure or chamber 31 is arranged below the diaphragm 10 of the loudspeaker 1. An outer peripheral wall of the frame structure 22 of the loudspeaker 1 is firmly attached to a mating wall surface of the sealed box 31 to form a substantially air tight coupling acoustically isolating the trapped air inside volume 30 from the surrounding environment. The enclosed volume 30 may be between 0.5 and 2.0 cm$^3$ such as about 1 cm$^3$ for typical portable terminal applications like mobile phones and smartphones. The mounting of the loudspeaker 1 in the sealed enclosure 30 leads to a higher fundamental resonance frequency of the miniature loudspeaker than its free-air fundamental resonance frequency discussed above due to a compliance of the trapped air inside the chamber 30. The compliance of the trapped air inside the chamber 30 works in parallel with the compliance of the resilient edge suspension 12 to decrease the total compliance (i.e. increase the stiffness) acting on the moving mass of the loudspeaker. Therefore, the fundamental resonance frequency of the enclosure mounted loudspeaker 1 is higher than the free air resonance. The amount of increase of fundamental resonance frequency depends on the volume of the enclosure 30. The wall structure surrounding the sealed enclosure 31 may be a formed by a molded elastomeric compound with limited impact strength.

Figure 2:
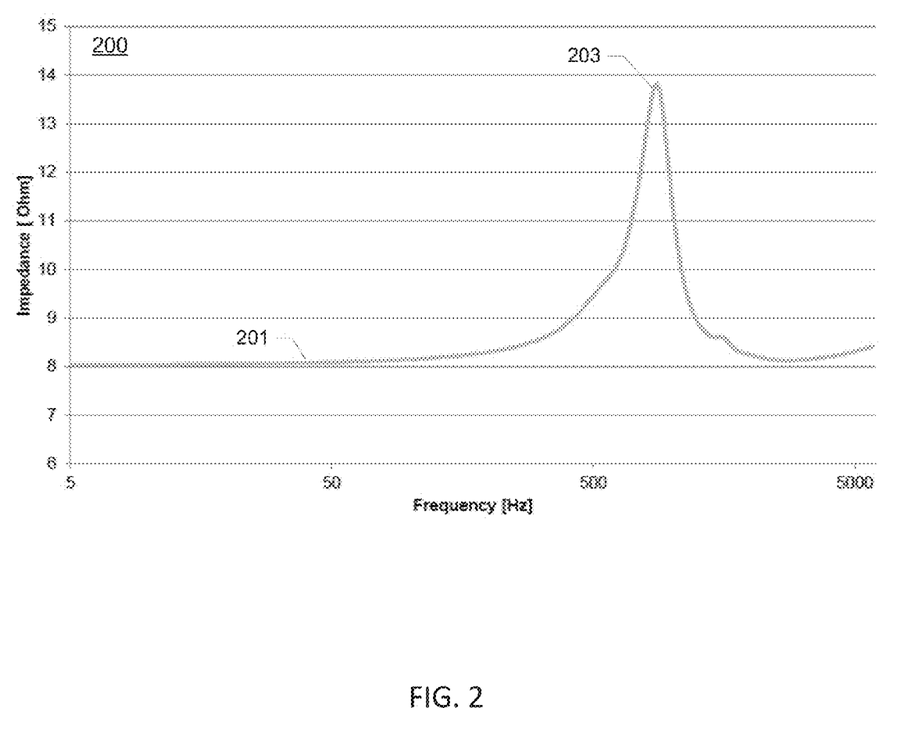
FIG. 2 shows experimentally measured loudspeaker impedance versus frequency curve of an exemplary miniature electrodynamic loudspeaker.

FIG. 2 shows a graph 200 depicting an experimentally measured curve 201 of impedance versus frequency of the miniature electrodynamic loudspeaker 1 mounted in a sealed enclosure with a volume of about 1 cm$^3$. The x-axis of graph 200 depicts measurement frequency on a logarithmic scale across a frequency range from 5 Hz to about 5 kHz and the y-axis shows the measured electrical impedance magnitude of the miniature speaker 1 on a linear scale spanning from approximately 6Ω to 15Ω. The measured fundamental resonance frequency of the loudspeaker 1 is located around 838 Hz as indicated by reference sign 203 and the accompanying peak impedance of the loudspeaker 1 is about 14Ω. At very low frequencies, for example below approximately 50 Hz, the impedance curve 201 remains essentially flat reflecting that the voice coil impedance gradually approaches a DC resistance of the voice coil of about 8Ω.

Figure 3:
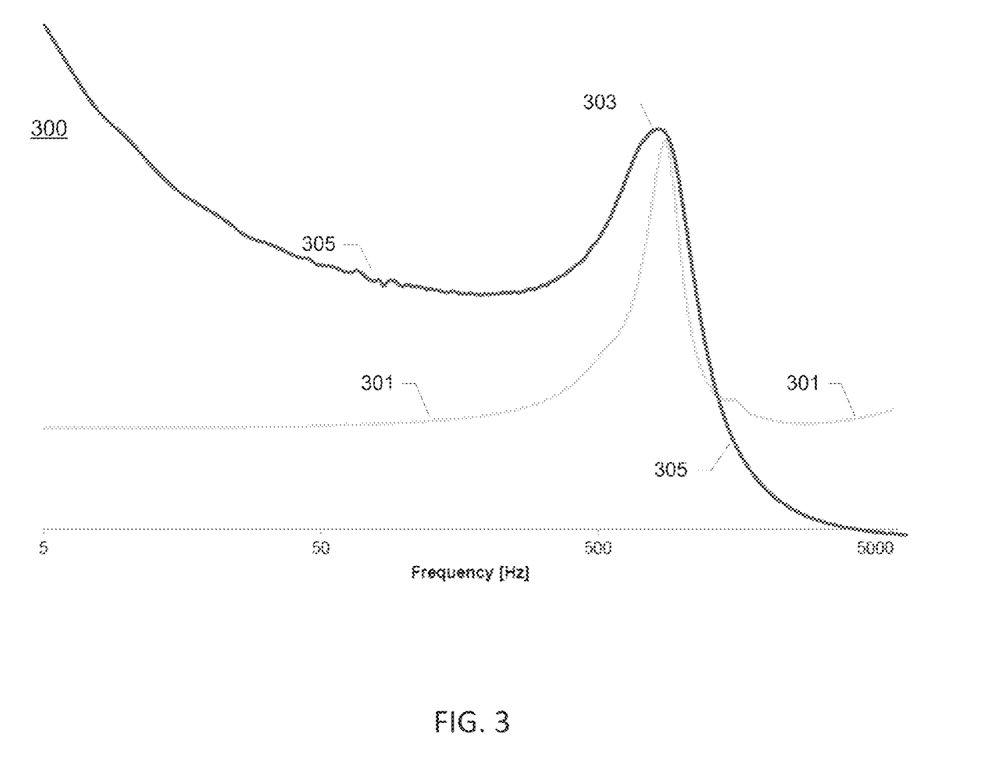
FIG. 3 shows a graph 300 of the loudspeaker impedance curve and a diaphragm excursion curve of the exemplary miniature electrodynamic loudspeaker 1.
Figure 4:
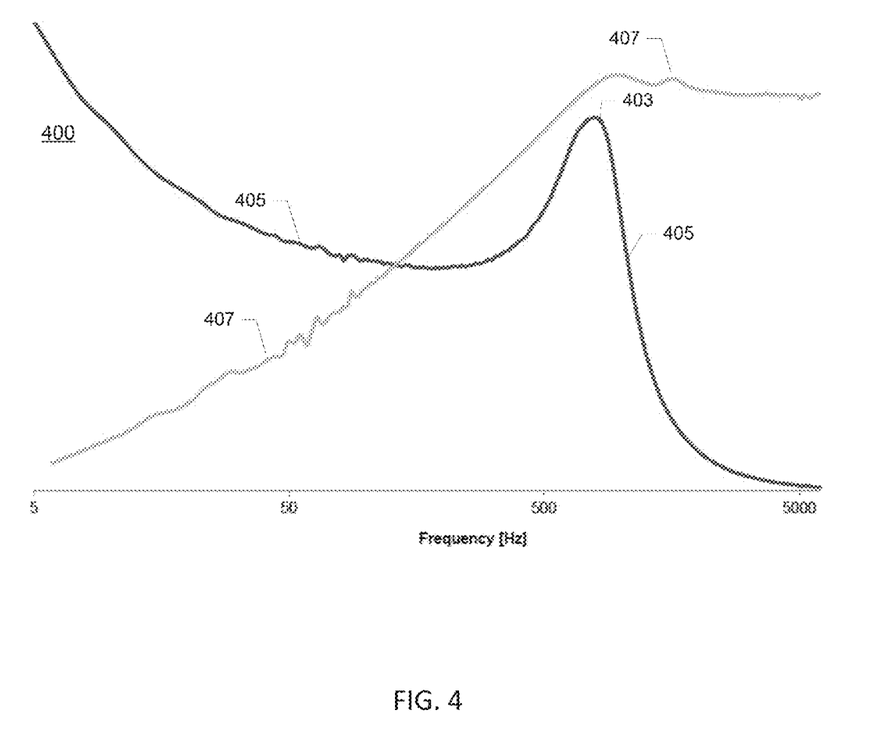
FIG. 4 is a graph showing curves of sound pressure level and diaphragm excursion of the exemplary miniature electrodynamic loudspeaker.

FIG. 3 is a graph 300 showing the loudspeaker impedance curve 301 and a corresponding diaphragm excursion curve 305 of the exemplary miniature electrodynamic loudspeaker 1 discussed above. The x-axis of graph 300 depicts measurement frequency on a logarithmic scale across a frequency range from 5 Hz to about 5 kHz. The y-axis shows the measured electrical impedance magnitude and diaphragm excursion of the miniature loudspeaker 1 on a dimensionless scale for comparison purposes. The diaphragm excursion has a local maximum at the fundamental resonance frequency of the loudspeaker 1 at about 838 Hz as indicated by reference sign 303. The frequency of this local maximum of the diaphragm excursion accordingly coincides with the peak impedance frequency of the loudspeaker 1. At frequencies well below the fundamental resonance frequency, the diaphragm excursion monotonically increases with decreasing frequency such that the diaphragm excursion exceeds the excursion at the fundamental resonance frequency at frequencies below approximately 25 Hz. Since a majority of signal energy of ordinary speech and music signals is concentrated in the low frequency range, the pronounced increase of diaphragm excursion in this frequency range can lead to irreversible mechanical damage of the loudspeaker unless proper precautionary actions are taken to limit the diaphragm excursion.

FIG. 4 is a graph 400 once again showing the diaphragm excursion curve 405 but this time together with a corresponding sound pressure level curve 407 of the exemplary miniature electrodynamic loudspeaker 1 discussed above. The x-axis of graph 400 depicts measurement frequency on a logarithmic scale across a frequency range from 5 Hz to about 5 kHz. The y-axis shows the diaphragm excursion and the sound pressure level of the miniature loudspeaker 1 on a dimensionless scale for comparison purposes. As expected for a sealed loudspeaker enclosure, the sound pressure level reaches a maximum around the fundamental resonance frequency of the loudspeaker 1, and the sound pressure level thereafter decreases monotonically at approximately 12 dB per octave for decreasing frequency.

Figure 5:
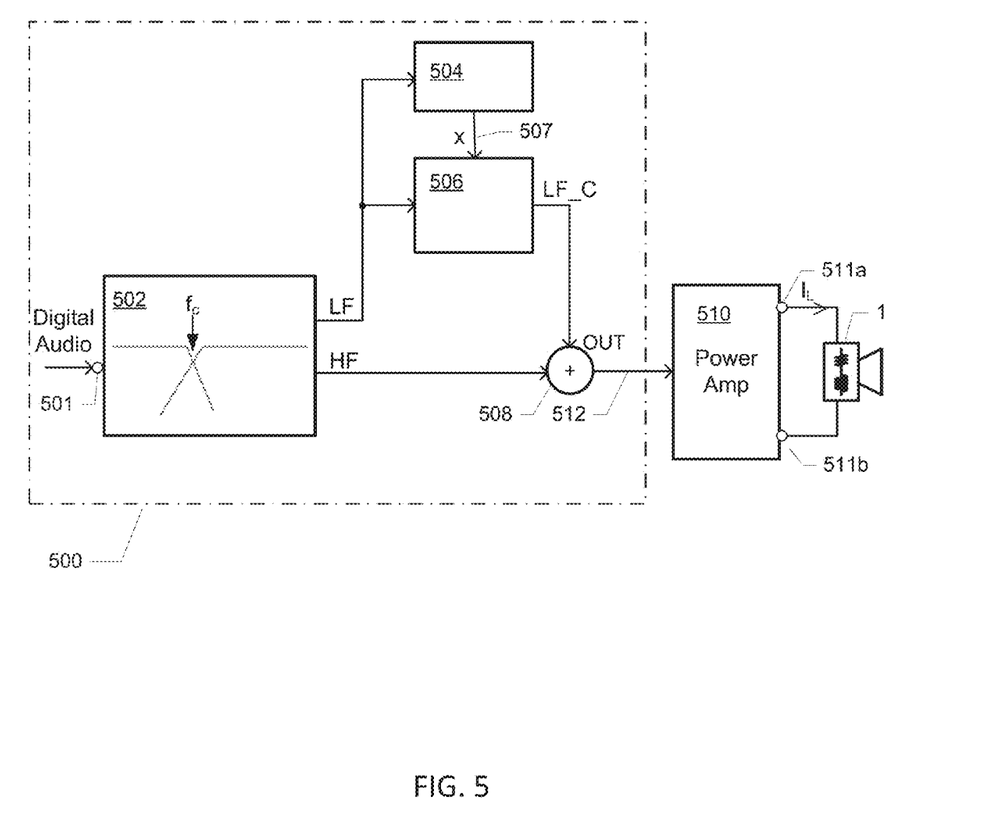
FIG. 5 shows a simplified schematic block diagram of a sound reproduction circuit for an electrodynamic loudspeaker in accordance with a first embodiment of the invention.

FIG. 5 shows a simplified schematic block diagram of a sound reproduction circuit 500 for electrodynamic loudspeakers, for example the enclosure mounted miniature loudspeaker 1 illustrated on FIG. 1B) above, in accordance with a first embodiment of the invention. The skilled person will appreciate that the sound reproduction circuit 500 can readily be adapted to numerous other types of enclosure mounted or open baffle mounted electrodynamic loudspeakers. This loudspeaker specific adaptation of the sound reproduction circuit 500 may comprise adjusting a cross-over frequency $f_c$ of a frequency band splitting network 502 depending on the electroacoustic characteristics of the loudspeaker and/or intended application.

The sound reproduction circuit 500 produces an excursion limited audio signal at terminal or wire 512 to an input of a power amplifier 510. The power amplifier 510 is coupled or connected to the miniature electrodynamic loudspeaker 1 through a pair of externally accessible speaker terminals 511a, 511b. The power amplifier 510 may comprise a pulse modulated Class D output amplifier, or any other suitable power amplifier for supplying adequate drive voltage and current for a voice coil of the miniature electrodynamic loudspeaker 1.

The sound reproduction circuit 500 comprises an audio input 501 for receipt of an audio input signal supplied by an audio signal source (not shown). In the present embodiment, the sound reproduction circuit 500 operates primarily or entirely in the digital domain manipulating and processing digital signals, but other embodiments of the invention may instead use analog signals or a mixture of analog and digital signals. The audio input 501 accordingly receives a digital audio input signal supplied by an external digital audio source such as an application processor of a portable communication device in which the present sound reproduction circuit 500 is integrated. The externally generated digital audio input signal may be formatted according to a standardized serial data communication protocol such as IIC or SPI, or formatted according to a digital audio protocol such as IIS, SPDIF etc. The sound reproduction circuit 500 further comprises the above-mentioned frequency band splitting network 502 which divides the digital audio input signal into a low-frequency band signal or component and a high-frequency band signal or component. The low-frequency band signal is supplied at a first output LF of the network 502 and the high-frequency band signal is supplied at a second output HF of the network 502.

The frequency band splitting network 502 has a predetermined cross-over frequency $f_c$ which preferably is at least 1.2 times the fundamental resonance frequency of the enclosure mounted miniature loudspeaker 1. The latter is about 829 Hz as discussed above. However, $f_c$ lies even more preferably at or above 2.0 times the 829 Hz fundamental resonance frequency of the enclosure mounted miniature loudspeaker 1 such as at or above 1628 Hz. Generally, $f_c$ typically lies somewhere between. The skilled person will appreciate by inspection of the diaphragm excursion curve 305 depicted on FIG. 3 that the latter value of $f_c$ ensures that all frequency components of the digital audio input signal that contribute significantly to the diaphragm excursion of the miniature loudspeaker 1 are included in the low-frequency band signal and therefore subjected to a signal limiting operation as discussed below in additional detail. The frequency response characteristics of the frequency band splitting network 502 may vary considerably depending on application specific requirements. The frequency band splitting network 502 operates entirely in the digital domain in the present embodiment such that each of the generated high-frequency and low-frequency band signals is a digital signal. The digital domain operation of the frequency band splitting network 502 provides considerable flexibility in the selection of the respective frequency response characteristics of a lowpass filter section and highpass filter section of the network 502 generating the low-frequency band signal LF and the high-frequency band signal HF, respectively. Each of the lowpass and highpass filter sections of the network 502 may comprise a FIR filter or an IIR filter. The band splitting network 502 may for example possess an allpass response such that summing the low-frequency band signal LF and the high-frequency band signal HF provides a substantially flat (constant magnitude) frequency response. Hence digital audio input signals at low levels may propagate through the frequency band splitting network 502 without frequency response modifications and hence without subjective signal colouring. A slope of the frequency response of the lowpass filter section above the predetermined cross-over frequency $f_c$ may vary depending on the application in question. The slope is preferably larger than 12 dB per octave, such as larger than 24 dB or 30 dB per octave, to reduce the leakage of high frequency signal components into the low-frequency band signal LF. Likewise, a slope of the frequency response of the highpass filter section below the predetermined cross-over frequency $f_c$ may vary depending on the application in question. The slope of the highpass filter section may be substantially identical to the slope of the lowpass filter section or different from the slope of the low-pass filter section. The slope of the highpass filter section is preferably larger than 12 dB per octave, such as larger than 24 dB or 30 dB per octave, to reduce the leakage of low frequency audio signal components into the high-frequency band signal HF. The skilled person will understand that the lowpass filter section may comprise a highpass filter with a corner frequency situated well below the predetermined cross-over frequency $f_c$, for example at a subsonic frequency below 20 Hz such that this embodiment converts the lowpass filter section to a bandpass filter section. The highpass filter of the latter bandpass filter section may be beneficial to suppress certain potentially harmful ultralow frequency components of the digital audio input signal. The miniature loudspeaker may for example be unable to reproduce these ultralow frequency components with any useful or audible sound pressure level given the frequency response curve 407 depicted on FIG. 4.

The digital low-frequency band signal LF is applied in parallel to an input of a diaphragm excursion estimator or calculator 504 and an input of a signal limiter 506. The diaphragm excursion estimator 504 is configured for producing an instantaneous diaphragm excursion estimate x based on the digital low-frequency band signal LF and apply the instantaneous diaphragm excursion estimate x to the signal limiter 506 via line or connection 507. The signal limiter 506 reads or receives the instantaneous diaphragm excursion estimate x and utilizes the latter to produce a limited low-frequency band signal at the output LF_C based on a comparison between the instantaneous diaphragm excursion estimate x and an excursion limit criterion. The limited low-frequency band signal at the output LF_C of the signal limiter 506 is attenuated or limited in level or amplitude by the operation of the signal limiter 506 relative to the low-frequency band signal LF at its input. Preferably, the signal limiting comprises dynamic range compression of the low-frequency band signal to reduce the amount of non-linear signal distortion introduced by the limiting operation. In the alternative, limiting of the low-frequency band signal LF may be performed by a simple peak clipping operation where positive and negative signal amplitudes of the low-frequency band signal LF exceed upper and lower thresholds, respectively, are clipped.

The dynamic range compression to limit the low-frequency band signal LF may comprise applying a diaphragm excursion dependent gain value to the low-frequency band signal in accordance with a predetermined gain law. The predetermined gain law may for example comprise a suitable table or a mathematical equation expressing a relationship or bond between the determined diaphragm excursion and the gain value. In one embodiment, the predetermined gain law comprises an excursion threshold value. The predetermined gain law of the latter embodiment additionally comprises a substantially constant gain of the low-frequency band signal below the excursion threshold value and a decreasing gain value with increasing diaphragm excursion above the excursion threshold value. In the latter embodiment, the low-frequency band signal LF may be multiplied by a constant, such as one, for all diaphragm excursion values falling below the excursion threshold value. Hence, the low-frequency band signal LF may be transmitted through the signal limiter 506 essentially unmodified such that the limited low-frequency band signal at the output LF_C is substantially identical to the low-frequency band signal LF at the input of the signal limiter 506. Above the excursion threshold value, the gain value may decrease monotonically having various rates of decrease. In some embodiments, the rate of decrease of gain value may ensure that the level of low-frequency band signal at the output LF_C is substantially constant for all diaphragm excursion values above the excursion threshold value. This corresponds to a substantially infinite compression ratio of the limited low-frequency band signal.

The skilled person will understand that the excursion threshold value can be set by numerous criteria in a particular embodiments depending for example on the type of application. In some embodiments, the excursion threshold value may be set to a maximum excursion of the electrodynamic loudspeaker as specified by the loudspeaker manufacturer or to a certain amount/percentage below this maximum excursion value. The skilled person will understand that the maximum excursion of a particular type of electrodynamic loudspeaker depends on its dimensions and numerous construction details of loudspeaker and its enclosure. For the above-discussed miniature loudspeaker 1 with outer dimensions of approximately 11 mm times 15 mm, the maximum diaphragm excursion is about +/−0.45 mm. However, larger loudspeaker types for home stereo and Public Address applications may have much larger maximum diaphragm excursions for example above +/−5.0 mm.

The limited low-frequency band signal at the output LF_C is applied to or transmitted to a first input of a summer 508 as illustrated by the schematic block diagram of the sound reproduction circuit 500. The high-frequency band signal HF is applied to, or transmitted to, a second input of the summer 508. The high-frequency band signal HF and the limited low-frequency band signal are combined to produce an excursion limited audio signal at an output OUT of the summer 508. The excursion limited audio signal is applied to the input of the power amplifier 510 which in turn generates a loudspeaker drive signal across the pair of loudspeaker terminals 511a, 511b as previously discussed.

The skilled person will appreciate that the functionality of each of the frequency band splitting network 502, diaphragm excursion estimator 504, signal limiter 506 and summer 508 may be implemented fully or partly by a software programmable microprocessor such as a programmable Digital Signal Processor as a set of executable program instructions operating on digital domain signals. In the alternative, the functionality of each of the frequency band splitting network 502, diaphragm excursion estimator 504, signal limiter 506 and summer 508 may be implemented by a separate hard-wired digital logic circuit comprising appropriately configured sequential and combinatorial digital logic. The hard-wired digital logic circuits may be integrated on an Application Specific Integrated Circuit (ASIC) or configured by programmable logic or any combination thereof. Various variable and constant values utilized by the sound reproduction circuit 500 such as the predetermined cross-over frequency $f_c$ of the frequency band splitting network, filter coefficients of the lowpass and highpass filter sections of the network 502 etc., may be stored in predetermined data memory addresses of a data memory accessible to the software programmable microprocessor or to the hard-wired digital logic circuits.

The diaphragm excursion estimator 504 may be implemented in numerous different ways. In some embodiments, the diaphragm excursion estimator 504 may be based on a sensor signal supplied by an acceleration, velocity or displacement sensor attached to, or coupled to, the diaphragm of the above-discussed miniature loudspeaker 1. A preferred embodiment of the diaphragm excursion estimator 504 is based on a linear or non-linear state space model of the electrodynamic loudspeaker as discussed below.

Figure 6:
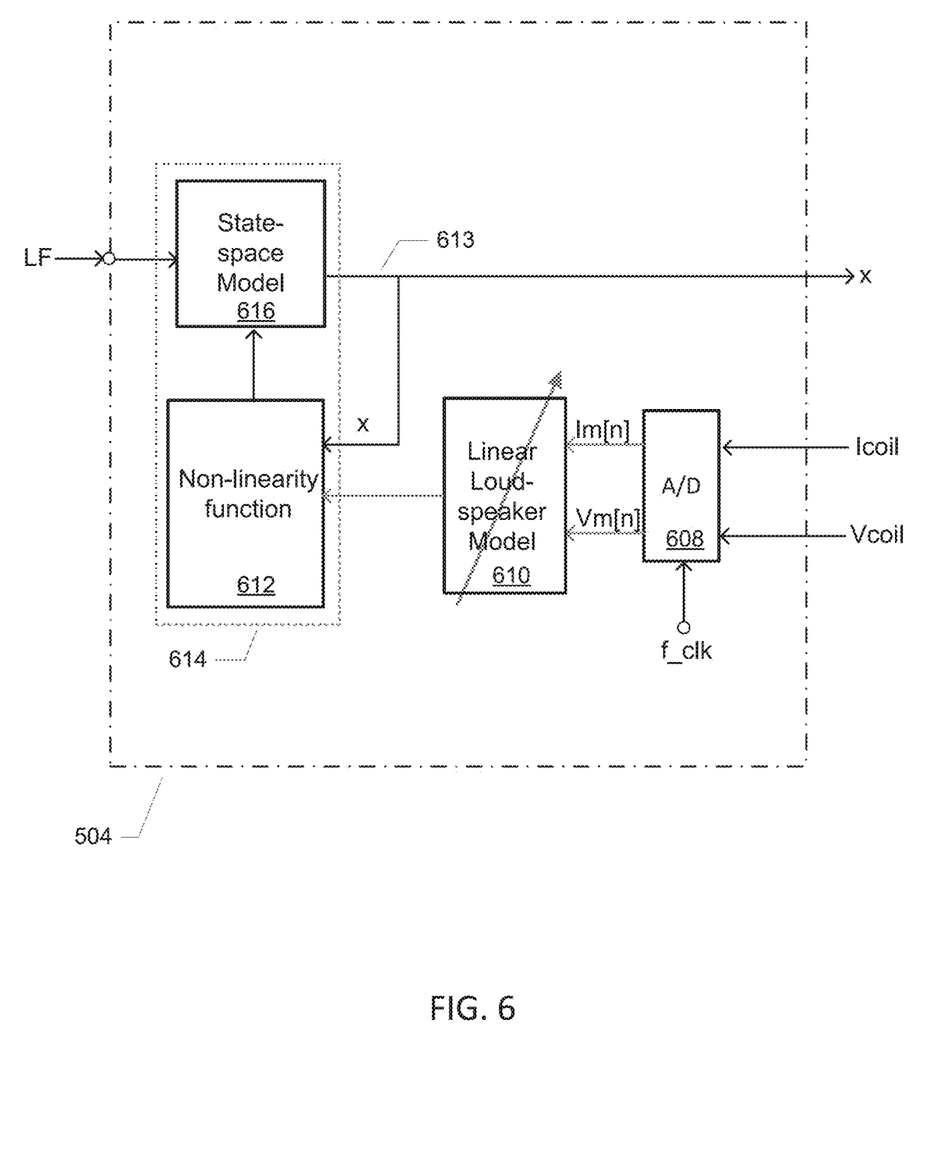
FIG. 6 shows a simplified schematic block diagram of an exemplary diaphragm excursion estimator for use in the sound reproduction circuit depicted on FIG. 5.

FIG. 6 shows a simplified schematic block diagram of a preferred embodiment of the diaphragm excursion estimator 504 depicted on FIG. 5. The diaphragm excursion estimator 504 comprises a non-linear state-space loudspeaker model 614 of the miniature loudspeaker 1. The low-frequency band signal LF is applied to an input of the non-linear state-space loudspeaker model 614. An estimate of the instantaneous diaphragm excursion, x, is computed or determined by the non-linear state-space loudspeaker model 614 and supplied at the output 613. The non-linear state-space loudspeaker model 614 may be identical to the non-linear state-space loudspeaker model described in the applicant's co-pending U.S. patent application Ser. No. 14/073,324 hereby incorporated by reference in its entirety. The operation and functionality of the non-linear state-space loudspeaker model is described in detail in this co-pending patent application. Hence, a short summary of the function of the non-linear state-space loudspeaker model is discussed below to demonstrate how the non-linear state-space loudspeaker model 614 may be integrated with the present diaphragm excursion estimator 504.

The diaphragm excursion estimator 504 comprises a linear adaptive digital model 610 of the electrodynamic loudspeaker 1 comprising a plurality of adaptable or adaptive model parameters that are adjusted in response to a digital voice coil current signal Im[n] and a digital voice coil voltage Vm[n]. The adaptive linear digital model 610 of the loudspeaker preferably comprises an adaptive filter which models a frequency dependent impedance of the miniature loudspeaker 1 across a predetermined audio frequency range, for example between 10 Hz and 10 kHz, based on the detected or measured voice coil current and voice coil voltage as represented by the digital voice coil current signal Im[n] and the digital voice coil voltage Vm[n]. The linear adaptive digital loudspeaker model 610 comprises a plurality of adaptive loudspeaker parameters. The linear adaptive digital loudspeaker model 610 is configured for computing a plurality of respective parameter values of the linear loudspeaker parameters. The details and functionality of the adaptive linear digital loudspeaker model 610 are also discussed in the applicant's above-mentioned co-pending U.S. patent application Ser. No. 14/073,324. The output of the linear adaptive digital loudspeaker model 610 comprises a plurality of parameter values of the respective linear, albeit time-varying, adaptive loudspeaker parameters, for example a force factor or suspension compliance of the enclosure mounted miniature loudspeaker 1. The plurality of parameter values outputted by the linear adaptive digital loudspeaker model 610 are supplied to a non-linear function block 612 which is a part of the non-linear state-space model 614 of the electrodynamic loudspeaker. The parameter values of the adaptive loudspeaker parameters represent or estimate respective current parameter values of the respective adaptive loudspeaker parameter such that the previously discussed time-varying and temperature varying properties of each of these are appropriately tracked. The skilled person will understand that the non-linear function block 612 is an optional feature of the present diaphragm excursion estimator 504. In other embodiments of the present diaphragm excursion estimator 504, the non-linear function block 612 is absent and the parameter values of the adaptive loudspeaker parameters are passed directly to a linear state-space model 616 of the electrodynamic loudspeaker 1. While the non-linear function block 612 may significantly improve the accuracy of the estimate of the instantaneous diaphragm excursion x in particular for large diaphragm excursions, the absence will often save computing resources and power consumption such that both alternatives may be highly useful depending on requirements of a particular application of the present sound reproduction circuit 500. For the purpose of delivering the digital voice coil current signal Im[n] and the digital voice coil voltage signal Vm[n] to the adaptive linear digital loudspeaker model 610, the diaphragm excursion estimator 504 comprises at least one A/D converter 608 that generates the digital voice coil current signal Im[n] and a digital voice coil voltage signal Vm[n] by sampling and digitizing the instantaneous voice coil voltage across the speaker terminals 511a, 511b. The A/D converter 608 furthermore comprises a second input that is configured to sample and digitize an analog voice coil current delivered at a second input, coil, of the converter 608.

The invention claimed is:

1. A method of controlling diaphragm excursion in a speaker, the method comprising:
when an audio input signal is being applied to a coil of a speaker, detecting at least one of a current flowing through a coil of the speaker and a voltage across the coil of the speaker;
splitting the audio input signal into a first component and a second component, the first component in a predetermined frequency band;
estimating a diaphragm excursion of the speaker using an adaptive digital model of the speaker, wherein the adaptive digital model includes a plurality of adaptive model parameters configured to be adjusted in response to the detected current or voltage, the estimating including applying information to the adaptive digital model about the detected current or voltage and about the first component of the audio input signal; and when a magnitude of the estimated diaphragm excursion exceeds a specified threshold value:
altering the first component of the audio input signal to provide an altered first component of the audio input signal, wherein the altering includes performing dynamic range compression on the first component without requiring clipping, and wherein the performing dynamic range compression on the first component includes applying a diaphragm excursion dependent gain value to the first component; and
combining the altered first component of the audio input signal with a second component of the audio input signal at another frequency band to provide a combined signal.

2. The method of claim 1, wherein the predetermined frequency band includes all frequencies below and including an expected resonance frequency of the speaker.

3. The method of claim 1, wherein the estimating comprises estimating the diaphragm excursion from a sensor signal returned from the speaker.

4. The method of claim 1, wherein splitting the audio input signal into a first component and a second component includes splitting the input signal into the first and second components according to a cross over frequency that is higher than an expected resonance frequency of the speaker.

5. The method of claim 4, wherein the cross over frequency is between 1.2 and 2.5 times the expected resonance frequency of the speaker.

6. The method of claim 4, further comprising adjusting the cross over frequency according to properties of the speaker.

7. The method of claim 1, further comprising, before the combining, suppressing low frequency components of the first component below the speaker's sound reproduction capabilities.

8. The method of claim 1, wherein the estimating the diaphragm excursion of the speaker using the adaptive digital model includes adjusting one or more parameters of the adaptive digital model based on the detected current flowing through the coil or the voltage across the coil of the speaker, and further includes estimating the diaphragm excursion based on the adjusted one or more parameters.

9. The method of claim 1, wherein applying a diaphragm excursion dependent gain value to the first component includes:
applying a diaphragm excursion dependent gain value to the first component in accordance with a predetermined gain law.

10. The method of claim 9, wherein the predetermined gain law comprises an excursion threshold value.

11. The method of claim 10, wherein the predetermined gain law further comprises a substantially constant gain of the first component below the excursion threshold value and a decreasing gain value with increasing diaphragm excursion above the excursion threshold value.

12. An apparatus, comprising:
a processor circuit configured to apply measured voice coil voltage or current information about a speaker to an adaptive digital model of the speaker to estimate a diaphragm excursion of the speaker in response to an input signal, wherein the adaptive digital model includes a plurality of adaptive model parameters configured to be adjusted in response to the detected current or voltage;
a band splitting system to split the input signal into a high-frequency component signal and a low-frequency component signal according to respective high frequency and low frequency components of the input signal,
a comparator to compare the estimated diaphragm excursion to a threshold value,
a signal limiter to alter the low-frequency component signal in response to an output of the comparator, wherein the signal limiter performs dynamic range compression on the low-frequency component signal as the alteration without requiring clipping, and wherein performing dynamic range compression on the low-frequency component signal includes applying a diaphragm excursion dependent gain value to the low-frequency component signal, and
a signal combiner to merge an output of the signal limiter and the high-frequency component signal from the band splitting system to produce an output signal.

13. The apparatus of claim 12, wherein the band splitting system has a cross over frequency that is higher than a resonance frequency of the speaker.

14. The apparatus of claim 13, wherein the cross over frequency is between 1.2 and 2.5 times the resonance frequency of the speaker.

15. The apparatus of claim 12, further comprising an amplifier having an input coupled to the signal combiner and an output for coupling to the speaker.

16. The apparatus of claim 15, wherein the amplifier is a pulse density modulation amplifier or a pulse width modulation amplifier.

17. The apparatus of claim 12, wherein the band splitting system, comparator and signal limiter are implemented by the processor circuit.

18. The apparatus of claim 12, wherein the band splitting system comprises a highpass filter section and a lowpass filter section each receiving the input signal.

19. The apparatus of claim 12, wherein the processor circuit is configured to estimate the diaphragm excursion of the speaker based on one or more parameters of the adaptive digital model, wherein the parameters include one or more of a mechanical compliance, a voice coil resistance, a moving mass, or a force factor of the speaker.

20. The apparatus of claim 12, wherein the signal limiter that applies a diaphragm excursion dependent gain value to the first component applies a diaphragm excursion dependent gain value to the first component in accordance with a predetermined gain law.

21. The apparatus of claim 20, wherein the predetermined gain law comprises an excursion threshold value.

22. The apparatus of claim 21, wherein the predetermined gain law further comprises a substantially constant gain of the first component below the excursion threshold value and a decreasing gain value with increasing diaphragm excursion above the excursion threshold value.

23. An apparatus, comprising:
a processor, executing program instructions that cause the processor to operate as:
a band splitting system to split an input signal into a high-frequency component signal and a low-frequency component signal according to respective high frequency and low frequency components of the input signal,
an estimator, configured to apply an adaptive digital model of a speaker to estimate excursion of the speaker's diaphragm based on the low-frequency component signal, wherein the adaptive digital model includes a plurality of adaptive model parameters configured to be adjusted in response to the detected current or voltage, a signal limiter to alter the low-frequency component signal when the estimated excursion exceeds a predetermined limit, wherein the signal limiter performs dynamic range compression on the low-frequency component signal as the alteration without requiring clipping, and wherein performing dynamic range compression on the low-frequency component signal includes applying a diaphragm excursion dependent gain value to the low-frequency component signal, and a signal combiner to merge an output of the signal limiter and the high-frequency component signal from the band splitting system to produce an output signal.

24. The apparatus of claim 23, wherein the instructions that cause the processor to operate as an estimator include instructions for the processor to estimate the diaphragm excursion based on one or more time-varying parameters of the adaptive digital model of the speaker.

25. The apparatus of claim 23, wherein the signal limiter that applies a diaphragm excursion dependent gain value to the first component applies a diaphragm excursion dependent gain value to the first component in accordance with a predetermined gain law.

26. The apparatus of claim 25, wherein the predetermined gain law comprises an excursion threshold value.

27. The apparatus of claim 26, wherein the predetermined gain law further comprises a substantially constant gain of the first component below the excursion threshold value and a decreasing gain value with increasing diaphragm excursion above the excursion threshold value.

* * * * *